United States Patent [19]

Suzuki

[11] Patent Number: 4,851,362
[45] Date of Patent: Jul. 25, 1989

[54] METHOD FOR MANUFACTURING A SEMICONDUCTOR DEVICE

[75] Inventor: Ken-ichi Suzuki, Tokyo, Japan

[73] Assignee: Oki Electric Industry Co., Ltd., Tokyo, Japan

[21] Appl. No.: 235,967

[22] Filed: Aug. 24, 1988

[30] Foreign Application Priority Data

Aug. 25, 1987 [JP] Japan ................... 62-209397
Aug. 25, 1987 [JP] Japan ................... 62-209398

[51] Int. Cl.4 .................................. H01L 29/72
[52] U.S. Cl. ............................ 437/31; 437/33; 437/162; 437/917; 357/59; 357/34; 357/49
[58] Field of Search ........... 437/31, 63, 70, 72, 437/33, 162, 917; 357/49, 50, 59 H, 34

[56] References Cited

U.S. PATENT DOCUMENTS

| 4,101,350 | 7/1978 | Possley et al. | 437/33 |
| 4,231,819 | 11/1980 | Raffel et al. | 437/46 |
| 4,669,180 | 6/1987 | Thomas et al. | 437/31 |
| 4,710,241 | 12/1987 | Komatsu | 437/21 |
| 4,735,912 | 4/1988 | Kawakatsu | 437/33 |
| 4,745,087 | 5/1988 | Iranmanesh | 437/69 |

FOREIGN PATENT DOCUMENTS

| 0160762 | 7/1987 | Japan | 357/34 |
| 0189753 | 8/1987 | Japan | 357/34 |
| 0211951 | 9/1987 | Japan | 357/34 |

OTHER PUBLICATIONS

T. Sasaki et al., "Gigabit Logic Bipolar Technology: Advanced Super Self-Aligned Process Technology", Electronics Letters, Apr. 14, 1983, vol. 8, pp. 283–284.
Ohuchi et al., "A New Self-Aligned Transistor Structure for High-Speed and Low-Power Bipolar LSI's", IEDM Technical Digest, 1983, pp. 55–58.
T. Nakamura et al., "Self-Aligned Transistor with Sidewall Base Electrode", ISSCC Technical Digest, 1981, pp. 214–215, 274.

Primary Examiner—Brian E. Hearn
Assistant Examiner—Tuan Nguyen
Attorney, Agent, or Firm—Wenderoth, Lind & Ponack

[57] ABSTRACT

A method for manufacturing a semicondcutor device includes, steps of forming a poly silicon layer at a predetermined area for a base electrode on a surface of a thin insulating film, forming an insulating film at a sidewall of the exposed poly silicon layer, growing first and second selective epitaxial layers on the exposed surface of a silicon substrate to connect the epitaxial layer with the poly silicon layer and forming an active base and an emitter in the epitaxial layer so that the poly silicon layer is constituted as a pull-out electrode for the base.

2 Claims, 5 Drawing Sheets

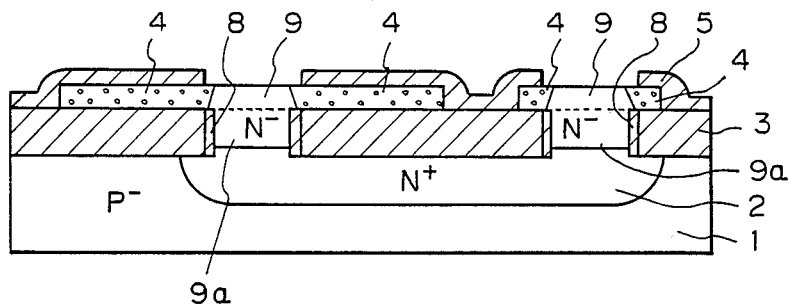
FIG. IE
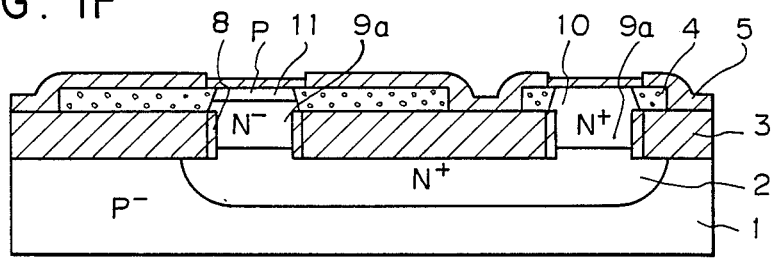
FIG. IF
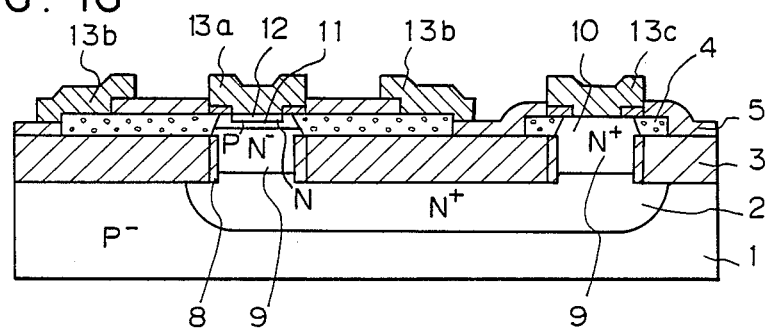
FIG. IG

METHOD FOR MANUFACTURING A SEMICONDUCTOR DEVICE

BACKGROUND OF THE INVENTION

This invention relates to a method for manufacturing an integrated semiconductor device which can achieve ultra high speed operation.

To accomplish high speed operation, there is utilized a bipolar type semiconductor device such as an ECL/CML (Emitter Coupled Logic/Current Mode Logic).

In the ECL/CML type circuit, operational speed is mainly determined by a parasitic capacitance accompanied with mutual interconnections between elements which constitute the circuit and a base resistance multiplied by a gain-bandwidth product of a transistor.

The most effective way to reduce the parasitic capacitance is to shrink a base area so that a junction capacitance, which influences greatly the operational speed, is provided between a base and a collector of a transistor.

On the other hand, to reduce the parasitic capacitance generated by the interconnection resistance, there is usually provided a structure in which resistors made of poly crystaline silicon are formed on a thick isolating oxide film.

To achieve reduction of the base resistance, it is necessary to reduce the resistance of an active base layer beneath an emitter by adjoining a low resistivity inactive base to the emitter and by shrinking the emitter width.

The gain-bandwidth product can be improved by reducing the junction capacitances between an emitter and a base and between a base and a collector by shrinking their planar scales, and it is further effective to shrink a vertical scale by shallowing base and emitter junctions or reducing a thickness of a collector epitaxial layer.

Among typical self-alignment techniques available to achieve high speed operation with gate delay time being less than 100 ps/gate, those of the following three articles are currently well-known:

(1) T. Sasaki et al. Electronics Letters, 14th April 1983 vol. 19 No. 8 P 283-284

(2) N. Ohuchi et al. IEDM Techinical Digest, 1983 P 55-58

(3) T. Nakamura et al. ISSCC Technical Digest, 1981 P 214-215, 274

These three techniques, although they differ from each other in transistor structure and manufacturing method, commonly employ a structure wherein a base electrode is disposed outside the element area by using poly crystaline silicon so that the base resistance can be reduced by shrinking the base region to reduce the junction capacitance between the base and the emitter and by adjoining a low resistivity poly crystaline silicon electrode to the emitter.

In other words, it is inevitably necessary to optimumly design the base structure when a high speed transistor is required.

The conventional proposed base structures of high speed bipolar transistor can be classified into two groups:

The first group is disclosed in the above articles (1) and (2) wherein there are provided an external base region with low resistivity to reduce the base resistance and a pull-out electrode made of poly crystaline silicon located above the external base region and adjucent to the emitter.

In this case, the external base region area should be formed as small as possible to prevent increase of the junction capacitance between the base and the collector.

This structure can be achieved by a relatively simplified process and also can realize both reduction of the base resistance and shrinkage of the base area.

On the other hand, the technique described in the article (3) relates to a method to realize an ideal structure having no external base by pulling out the base electrode made of buried poly crystaline silicon from a side wall of the active base.

According to this technique, there exists almost no external base region so that the base-collector junction is constituted only by the active base region with low impurity concentration whereby both the junction capacitance between the base and the collector and the base resistance are tremendously reduced.

The former technique, still requires the external base, though there is the advantage that the process is relatively simple, which restricts the reduction of the junction capacitance between the base and the collector.

The latter technique, though it provides an ideal base structure mostly suitable for high speed operation, requires complicated manufacturing processes to form the buried poly crystaline silicon electrode which generates induced defects in a selective oxidizing process and makes it difficult to form a poly crystaline silicon electrode with reproducibility.

SUMMARY OF THE INVENTION

An object of the present invention is to provide a method for manufacturing a semiconductor device which would reduce a junction cabacitance between a base and a collector.

Another object of the present invention is to provide a method for manufacturing a semiconductor device which would simplify a formation of a buried poly crystaline silicon electrode.

A further object of the present invention is to provide a method for manufacturing a semiconductor device which would prevent induced defects in a selective oxidizing process.

A still further object of the present invention is to provide a method for manufacturing a semiconductor device which would guarantee reproducibility of the device.

To accomplish the above objects, there is provided a method for manufacturing a semiconductor integrated circuit device comprising steps of: (a) forming a first insulating film on a semiconductor substrate having a buried diffusion region; (b) forming a polycrystaline semiconductor layer on a predetermined surface of the first insulating film and subsequently covering with a second insulating film; (c) forming an opening penetrating through the second insulating film, the poly crystaline semiconductor layer and the first insulating film to reach a surface of the semiconductor substrate; (d) forming a third insulating film on a sidewall of the poly crystaline semiconductor layer exposed by forming the opening; (e) selectively forming a first step single crystaline semiconductor layer on the exposed semiconductor substrate; (f) removing, subsequent to the step (e), the third insulating film to expose the sidewall of the poly crystaline semiconductor layer; (g) selectively forming a second step single crystaline semiconductor layer on the first step single crystaline semiconductor layer so as to be connected to the poly crystaline semiconductor layer; and (h) forming an active base region and an emitter region in the second step single crystaline semiconductor layer.

There is also provided another method for (a) forming a first insulating film on a semiconductor substrate having a buried diffusion region; (b) forming a polycrystaline semiconductor layer on a predetermined surface of the first insulating film and subsequently covering with a second insulating film; (c) forming an opening penetrating through the second insulating film, the poly crystaline semiconductor layer and the first insulating film to reach a surface of the semiconductor substrate; (d) forming a third insulating film on a sidewall of the poly crystaline semiconductor layer exposed by forming the opening; (e) selectively forming a first step single crystaline semiconductor layer on the exposed semiconductor substrate; (f) removing, subsequent to the step (e), the third insulating film to expose the sidewall of the poly crystaline semiconductor layer; (g) selectively forming a second step single crystaline semiconductor layer on the first step single crystaline semiconductor layer so as to be connected to the poly crystaline semiconductor layer (h) forming a forth insulating film by means of self-alignment on a sidewall of the second insulating film so as to cover a juncture of the exposed second step single crystaline semiconductor layer and the poly crystaline semiconductor layer; and (i) forming an opening within the first mentioned opening for diffusion to make an emitter region.

BRIEF DESCRIPTION OF THE DRAWINGS

FIGS. 00(A)–(2I) are sectional views illustrating respective steps according to a second embodiment of the present invention.

DETALLED DESCRIPTION OF THE INVENTION

FIG. 1(A)–FIG. 1(G) show sectional views of a transistor illustrating respective manufacturing steps according to the present invention.

Figure 1A:
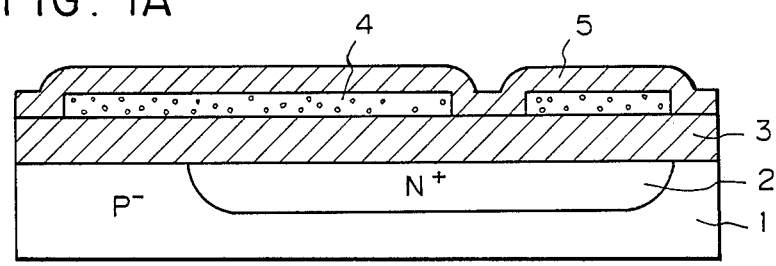
FIGS. 1(A)–(1G) are sectional views illustrating respective steps according to a first embodiment of the present invention.

In FIG. 1(A), a silicon dioxide film 3 with an approximate 1 um thickness is formed on a P− substrate 1 having an N+ buried diffusion region 2. Then, as illustrated in the drawing, a poly crystaline silicon layer 4 of 0.3–0.5 um thickness is formed, which is constituted as a low resistivity poly crystaline semiconductor layer by doping a P type impurity, at a predetermined area of the silicon dioxide film 3, and the entire surface of the thus formed structure is covered with a CVD dioxide film 5 of 0.3–0.5 um thickness.

Figure 1B:
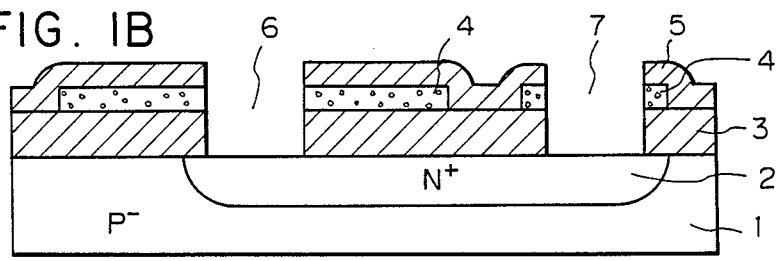

Consecutively, as shown in FIG. 1(B), openings 6 and 7 reaching to the N+ buried diffusion region 2 are formed by anisotropic etching on predetermined regions where an active base region and a collector electrode region will be formed later.

Then, a CVD oxide film of 0.2–0.3 um thickness formed on the entire surface of the structure is removed excepting sidewalls of the opinings 6 and 7 so that a residual oxide film becomes an insulating film 8 which will later prevent a growth of silicon at the sidewall of the poly crystaline silicon layer 4 in a subsequent epitaxial growth process.

The manufacturing process of the insulating film 8 is not limited to the above mentioned technique but can be achieved by operations of thermal oxidation and anisotropic etching.

Then, a selective epitaxial growth process is conducted on the single crystaline silicon layer, that is, the N+ buried diffusion region 2, exposed at the bottom of the openings 6 and 7.

The above epitaxial growth can be easily achieved, for example, under conditions of 900° C.–1,000° C. temperature and 20–100 Torr. atomic pressure by adding HCl to a source gas such as $SiH_2Cl_2$.

An epitaxial layer 9a is grown with two steps.

Figure 1C:
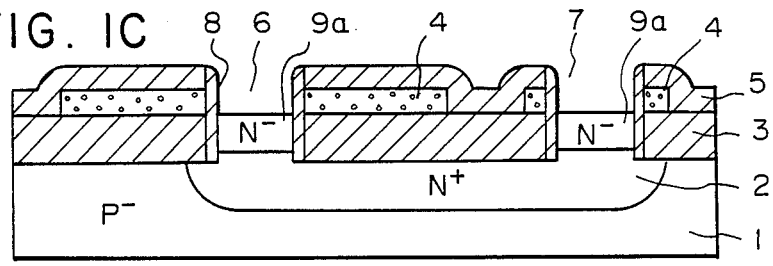

In the first step, as shown in FIG. 1(C), the epitaxial growth is conducted within the openings 6 and 7 in such a manner that the top surface of the layer 9a reaches approximately the same level of the bottom line of the poly crystaline silicon layer 4.

Figure 1D:
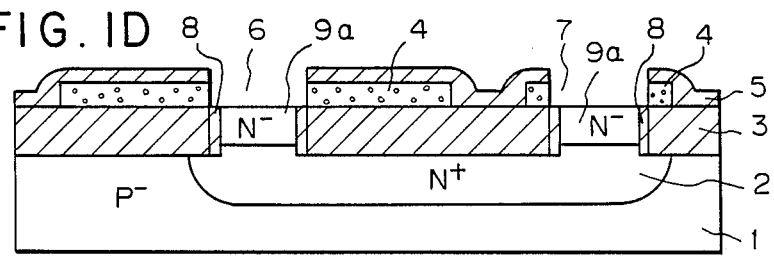

Consecutively, the oxide 8 which covers the sidewall of the poly crystaline silicon layer 4 is removed to expose, as shown in FIG. 1(D), the sidewall of the poly crystaline silicon layer 4.

Next, as shown in FIG. 1(E), the second step selective epitaxial growth is conducted to an extent that the top surface of the epitaxial layer 9 reaches substantially the same level of as the top surface of the poly crystaline silion layer 4 so that the epitaxial layer 9 is connected to the poly crystaline silicon layer 4.

Then, as illustrated in FIG. 1(F), a collector pull-out region 10 with low resistivity and an active base region are respectively formed in the epitaxial layer 9.

Further, as shown in FIG. 1(G), an emitter 12 is formed in the active base region 11 and an emitter electrode 13a, a base electrode 13b and a collector electrode 13c respectively are formed.

The base electrode 13b is electronically connected to the poly crystaline silicon layer 4, and the base electrode 13b becomes a pull-out electrode to the active base region 11 through the poly crystaline silicon layer 4 so that an ideal transistor structure is achieved with the buried poly crystaline silicon base electrode. According to the first embodiment, the a buried poly crystaline silicon base structure with high speed operation can be realized so that a transistor having less than 100 ps/gate delay time can be achieved with high controllability and reproducibility.

Figure 2A:
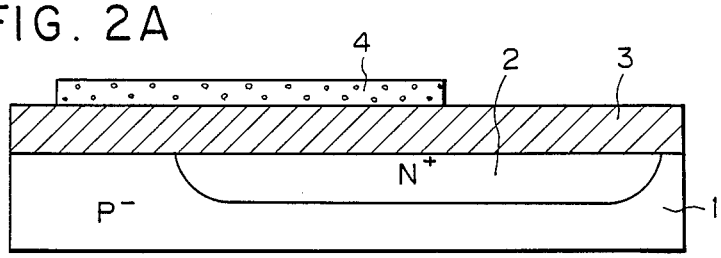
Figure 2B:
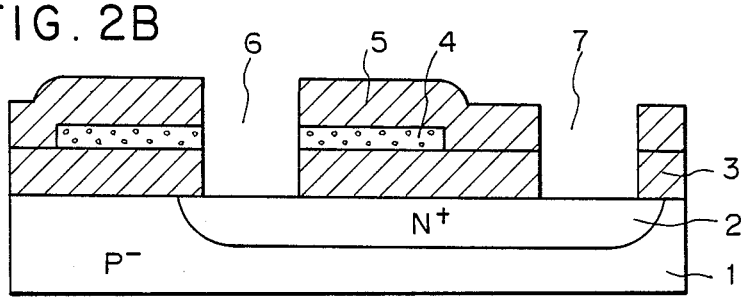
Figure 2C:
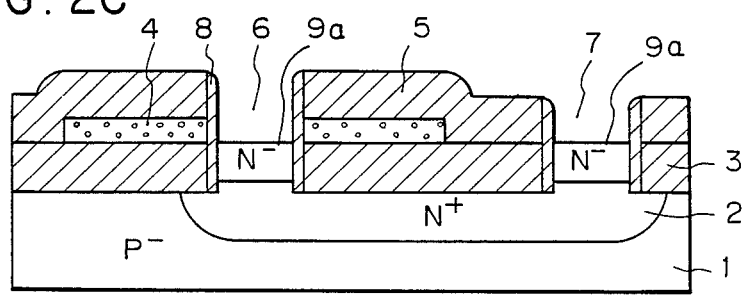
Figure 2D:
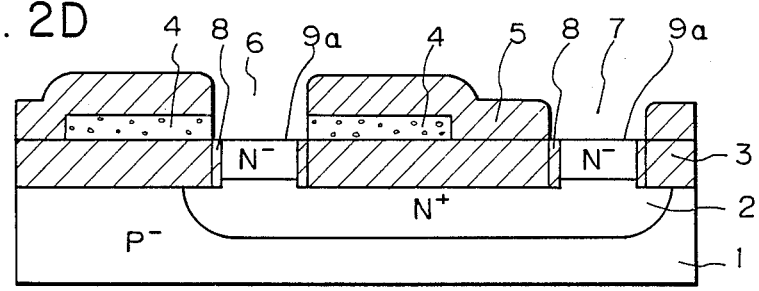
Figure 2E:
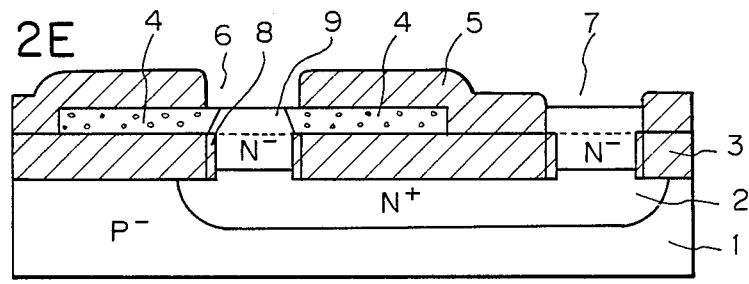

FIGS. 2(A)–(2I2) show the second embodiment illustrating respective manufacturing steps according to the present invention.

Figure 2F:
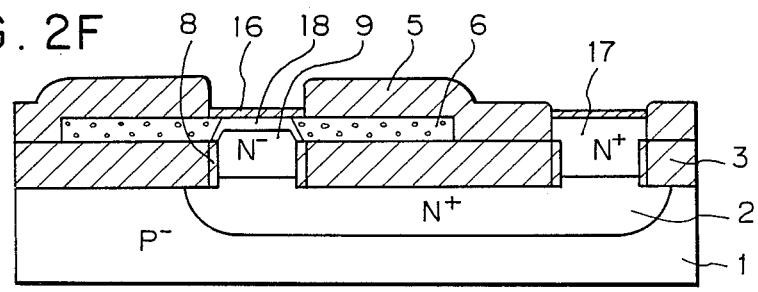

Since each of the views and manufacturing steps shown in FIGS. 2(A)–2(E) corresponds to each of those in FIGS. 1(A)–1(E), a detailed explanation of this embodiment will be started from the step shown in FIG. 2(F).

After forming a thin thermal oxide film 10, as shown in FIG. 2(F), on the surface of the epitaxial layer 9, an N+ region 17 is ion-implanted to reduce collector resistance and to achieve ohmic contact with an electrode. Then, an active base region 18 is formed by ion-implanting a P-type impurity to the entire surface of the structure.

In this instance, as the P-type impurity can be diffused to the epitaxial layer 9 from the P-type poly crystaline silicon layer 4, a PN junction will be formed within the epitaxial layer 9.

Figure 2G:
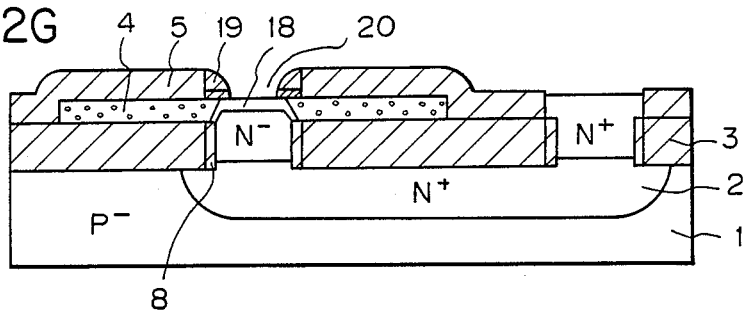

Thereafter, subsequent to forming a relatively thick third CVD oxide film of approximate by 0.3–0.7 um thickness, anisotropic etching is applied so that the third CVD oxide film 19 partially remains at the sidewall of the first CVD oxide film 5, whereby an opening 20 for emitter diffusion can be formed by means of a self alignment technique as shown in FIG. 2(G).

The thickness of the third CVD oxide film 19 as well as the width of the opening 6 has a large influence on determining emitter size.

Therefore, an emitter having a of submicron level can be achieved by controlling the thickness of the oxide film 19.

The boundary between the poly crystaline silicon layer 4 and the epitaxial layer 9 (the active base region 12) is protected by both the third oxide film 19 and a thin thermal oxide film 16 so that the emitter region is necessarily formed within the epitaxial layer 9.

Figure 2H:
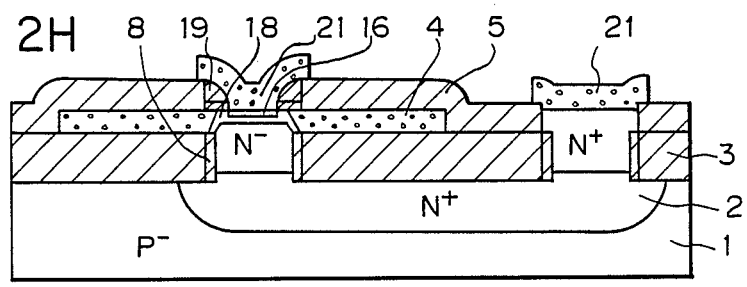

Then, as shown in FIG. 2(H), a poly crystaline silicon electrode 21 for the emitter and the collector is formed by diffusion to make a shallow emitter junction.

Figure 2I:
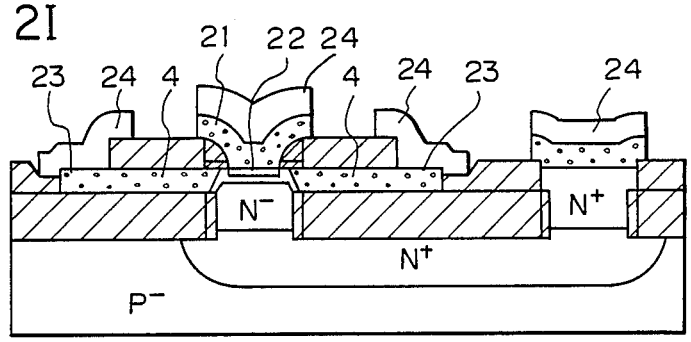

Finally, as shown in FIG. 2(I), the insulating film 5 is partially removed to make opening 23 for contact with the poly crystaline silicon layer 4 whereby the transistor structure is completed by wiring an interconnection pattern 24.

According to the second embodiment of the invention, a ultra high speed transistor having 50 ps/gate delay time can be realized.

What is claimed is:

1. A method for manufacturing a semiconductor integrated circuit device comprising the steps of:
   (a) forming a first insulating film on a semiconductor substrate having a buried diffusion region;
   (b) forming a poly crystalline semiconductor layer on a predetermined surface of the first insulating film and subsequently covering the same with a second insulating film;
   (c) forming an opening penetrating through the second insulating film, the poly crystalline semiconductor layer and the first insulating film to reach a surface of the semiconductor substrate;
   (d) forming a third insulating film on a side wall of the poly crystalline semiconductor layer exposed by forming the opening;
   (e) selectively forming a first step single crystalline semiconductor layer on the exposed semiconductor substrate;
   (f) removing, subsequent to step e), the third insulating film to expose the sidewall of the poly crystalline semiconductor layer;
   (g) selectively forming a second step single crystalline semiconductor layer on the first step single crystalline semiconductor layer so as to be connected to the poly crystalline semiconductory layer; and
   (h) forming an active base region and an emitter region in the second step single crystalline semiconductory layer.

2. A method for manufacturing a semiconductor integrated circuit device comprising the steps of:
   (a) forming a first insulating film on a semiconductor substrate having a buried diffusion region;
   (b) forming a poly crystalline semiconductor layer on a predetermined surface of the first insulating film and subsequently covering the same with a second insulating film;
   (c) forming an opening penetrating through the second insulating film, the poly crystalline semiconductor layer and the first insulating film to reach a surface of the semiconductor substrate;
   (d) forming a third insulating film on a sidewall of the poly crystalline semiconductor layer exposed by forming the opening;
   (e) selectively forming a first step single crystalline semiconductor layer on the exposed semiconductor substrate;
   (f) removing, subsequent to step e, the third insulating film to expose the sidewall of the poly crystalline semiconductor layer;
   (g) selectively forming a second step single crystalline semiconductor layer on the first step single crystalline semiconductor layer so as to be connected to the poly crystalline semiconductor layer;
   (h) forming a fourth insulating film by means of self-alignment on a sidewall of the second insulating film so as to cover a juncture of the exposed second step single crystalline semiconductor layer and the poly crystalline semiconductor layer; and
   (i) forming an opening within the first mentioned opening for diffusion to form an emitter region.

* * * * *